United States Patent
Hamada

[11] Patent Number: 6,144,678
[45] Date of Patent: Nov. 7, 2000

[54] EXTERNAL CAVITY SEMICONDUCTOR LASER LIGHT SOURCE

[75] Inventor: Madoka Hamada, Tokyo, Japan

[73] Assignee: Ando Electric Company, Ltd., Tokyo, Japan

[21] Appl. No.: 09/156,608

[22] Filed: Sep. 18, 1998

[30] Foreign Application Priority Data

Sep. 19, 1997 [JP] Japan ................................. 9-255451

[51] Int. Cl.[7] ...................................... H01S 3/10
[52] U.S. Cl. ............................... 372/20; 372/29
[58] Field of Search ................. 372/29, 32, 38, 372/72, 75, 92, 96, 98, 102

[56] References Cited

U.S. PATENT DOCUMENTS

| | | | |
|---|---|---|---|
| 5,161,165 | 11/1992 | Zorabedian | 372/20 |
| 5,570,221 | 10/1996 | Fujita | 359/161 |
| 5,943,352 | 8/1999 | Fee | 372/32 |

*Primary Examiner*—Frank G. Font
*Assistant Examiner*—Gioacchino Inzirillo
*Attorney, Agent, or Firm*—Pillsbury Madison & Sutro LLP

[57] ABSTRACT

An external cavity semiconductor laser light source which comprises: an external cavity semiconductor laser light source unit; an optical filter for selecting an output beam of the external cavity semiconductor laser light source unit in a single mode; a drive unit for varying a wavelength of a transmitted light or a wavelength of a reflected light, from the optical filter; a wavelength control unit for controlling the drive unit; an optical frequency reference light source for generating a light having a reference optical frequency; an optical frequency/voltage conversion unit for generating a signal which corresponds to a difference in optical frequency between the light outputted from the optical frequency reference light source and the output beam of the external cavity semiconductor laser light source unit; a low pass filter for transmitting a low-frequency component of the signal of the optical frequency/voltage conversion unit; a switch for feeding the signal into the external cavity semiconductor light source and for interrupting the signal; and a frequency control unit for switching on and off the switch to control the drive unit.

7 Claims, 14 Drawing Sheets

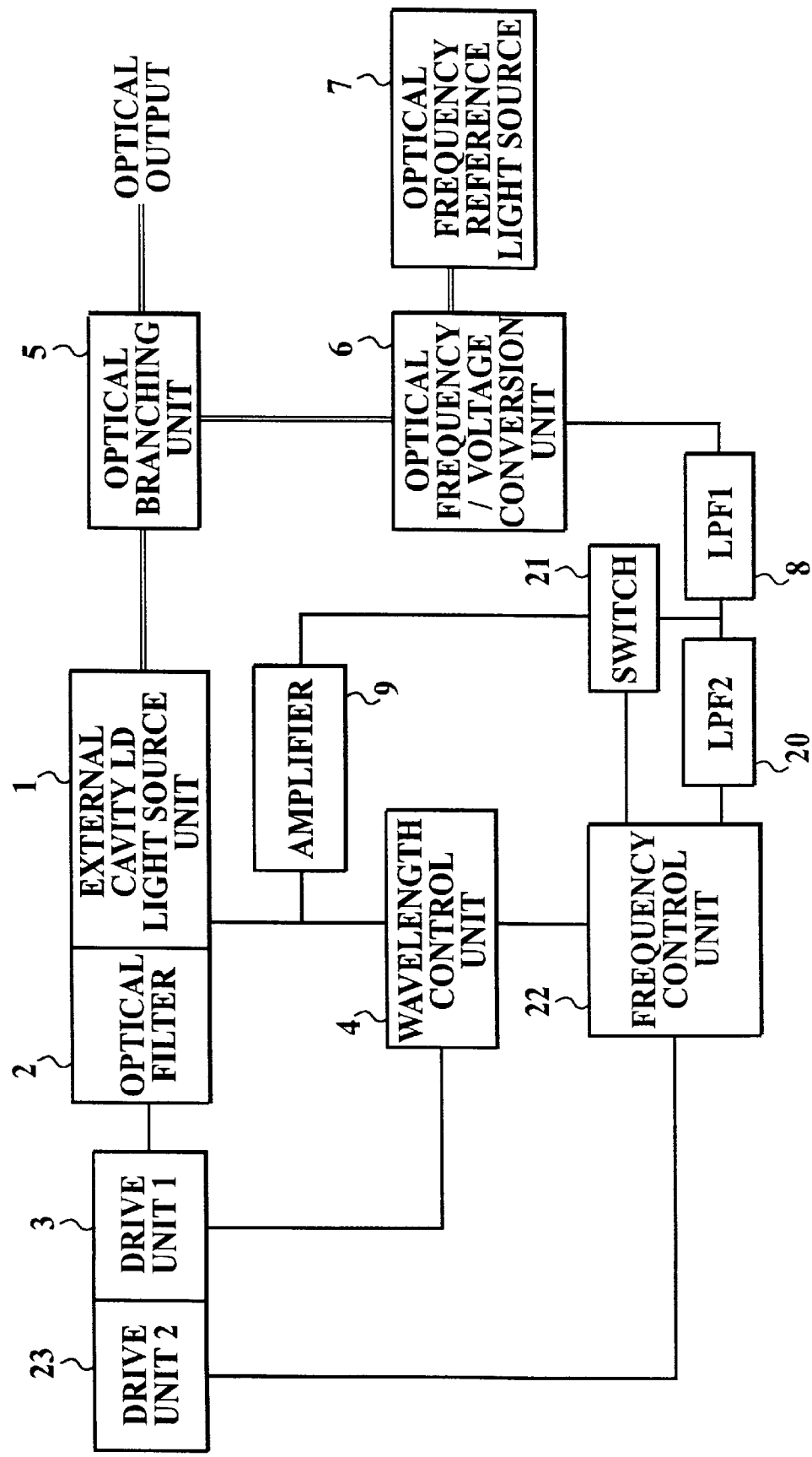

EXTERNAL CAVITY SEMICONDUCTOR LASER LIGHT SOURCE

BACKGROUND OF THE INVENTION

1. Field of the Invention

The present invention relates to an external cavity semiconductor laser light source which is used in any technical field which requires a light signal source, in particular, which is used in an optical telecommunication or a coherent optical measuring technical field.

2. Description of the Related Art

In the coherent optical measuring technical field, an external cavity semiconductor laser (hereinafter, may be simply referred to LD) is generally used as a light source unit in a light source tunable in wavelength. An optical filter which is a wavelength selection element is disposed in the external resonator thereof to get a single mode oscillation.

Such a technique enables wavelength scanning in a wide range by mechanically varying the transmitted (or reflected) wavelength from the optical filter.

In an optical frequency stabilized member, an optical PLL (phase-looked loop) for feeding back an electric current into an LD driving current, which is proportional to a difference in frequency between an output light and a reference light is generally used.

FIG. 5 shows a construction example of an optical frequency stabilized external type of LD light source according to an earlier development. In FIG. 5, the reference numeral 1 denotes an external cavity LD light source unit, 2 denotes an optical filter, 3 denotes a first driving unit (drive unit 1), 4 denotes a wavelength control unit, 5 denotes an optical branching unit, 6 denotes an optical frequency/voltage conversion unit, 7 denotes an optical frequency reference light source, 8 denotes a first low pass filter (LPF1) and 9 denotes an amplifier.

First, the basic operation of the external cavity LD light source will be explained.

The first drive unit 3 can mechanically change wavelength of the transmitted beam or of the reflected beam, from the optical filter 2, and when occasion demands, it serves as a wavelength scanning mechanism for carrying out also adjustment for the length of an external resonator.

The relationship between the state of the first drive unit 3 and the oscillation wavelength of the external resonator is already known. In the wavelength control unit 4, a wavelength set can be carried out with the wavelength resolution of about 1 pm on the basis of a formula showing the known relationship. When occasion demands, the wavelength control unit 4 also controls the LD drive current in order to control the optical output level of the LD light source unit 1.

FIG. 6 shows a construction example of an external cavity LD light source unit 1. In FIG. 6, the reference numeral 101 denotes a diffraction grating; 102, 105 and 107 denote lenses; 103 denotes an anti-reflection film; 104 denotes an LD; 106 denotes an optical isolator; 108 denotes an optical fiber; and 109 denotes an LD driving circuit.

In the external cavity LD light source unit 1 shown in FIG. 6, the diffraction grating 101 which corresponds to the above-described optical filter 2, as shown in FIG. 5, also functions as a mirror in one side of the external resonator.

That is, the external resonator is formed by the end surface B of the LD and the diffraction grating 101. The length of the resonator is defined by the segment AB of a line from the end surface B of the LD to the point A at which the grating surface of the diffraction grating 101 intersects the optical axis X of the diffraction grating 101.

An anti-reflection film 103 is formed on an end surface in the side of the diffraction grating 101, of the LD 104 in order to remove unnecessary reflection.

Each of the lenses 102 and 105 is a collimator for changing the output beam of the LD 104 to a collimated beam.

The output beam from the external resonator LD 104, which is obtained from the side of the LD end surface B, is condensed through the lens 107 and is taken out by the optical fiber 108.

In order to generate no noise due to external feedback beam from a following optical system, the optical isolator 106 is disposed on the way in the output side.

The LD driving circuit 109 feeds an LD driving current corresponding to a desired optical output level, and is controlled by the wavelength control unit 4 shown in FIG. 5, as described above.

Although only the diffraction grating 101 is shown in FIG. 6, as the above-described optical filter 2 shown in FIG. 5, it is possible to use an optical element other than the diffraction grating 101, for example, to use an interference filter or the like, as the optical filter 2. When occasion demands, combination of a plurality of optical elements can be also used as the optical filter 2.

Next, the characteristics of an optical filter will be explained as follows.

FIG. 7 shows an optical filter of the diffraction grating 101. In this Figure, θ is the angle of the normal $N_{gr}$ to the diffraction grating 101 with the optical axis, d is the pitch of the diffraction grating, and the incident light and the reflected (diffracted) light are set on the same optical axis X, like the above-described external resonator shown in FIG. 5.

The spectrum of the reflected light when an incident white light came into the diffraction grating 101 is the filter light characteristics of the diffraction grating. A filter characteristics is obtained, as shown in FIG. 8.

The reflection peak wavelength $\lambda_{gr}$ is given by the following Bragg's formula:

$$\lambda_{gr} = 2\ d \times \sin(\theta) \qquad (1)$$

The characteristics of the interference filter 201 in the optical system shown in FIG. 9 has periodic transmittance peaks, as shown in FIG. 10.

In FIG. 9, "D" is the thickness of the interference filter 201, and "n" is the refractive index thereof.

The wavelength of each transmittance peak is given by the following formula:

$$k\lambda_k = 2nD \times \cos(\phi) \qquad (2)$$

where φ is the angle of the normal N to the interference filter 201 with the optical axis in the interference filter 201, and k is an integer.

When L is the length of the external resonator and m is an integer, like the case of an interference filter, the oscillation longitudinal mode wavelength $\lambda_m$ of the external resonator is expressed as follows:

$$m\lambda_m = 2\ L \qquad (3)$$

Next, an example of characteristics of wavelength tunable LD light source, using an optical filter comprising a combination of a diffraction grating and an interference filter is illustrated in FIGS. 11A to 11E.

FIG. 11A shows a gain characteristics of LD, which generally has a gain in a wavelength range not less than 100 nm.

FIG. 11B shows a resonator mode corresponding to the formula (3), which are oscillation longitudinal modes.

Several modes are selected by using the filter characteristics of the diffraction grating 101, corresponding to the formula (1), which is shown in FIG. 11C among the oscillation modes.

Then, a signal mode is selected by using the filter characteristics of the interference filter, corresponding to the formula (2), which is shown in FIG. 11D. As a result, a single mode oscillation is obtained, as shown in FIG. 11E.

By changing each of the characteristics shown in FIGS. 11B, 11C and 11D, that is, by changing L, $\theta$ and $\phi$, suitably, it is possible to carry out wavelength scanning.

The relationship between the wavelength and L, $\theta$ and $\phi$ is found on the basis of previous measurements. According to the relationship, the first drive unit 3 having a combination of a motor, a rotary table, a directly linear-moving mechanism and the like realizes a state of particular values of L, $\theta$ and $\phi$, corresponding to the set wavelength which is set at intervals of 1 pm.

The above descriptions are the explanations of the basic operation of the external cavity LD light source.

Next, an optical frequency stabilizing method will be explained below.

In the optical frequency stabilizing method which is described below, an optical PLL which is well-known as an optical frequency controlling method is used.

In FIG. 5, an output beam of the external cavity LD light source unit 1 is branched by an optical branching unit 5. One of the branched output beams is an optical output to be outputted from the external cavity LD light source, and the other is one incident light of an optical frequency/voltage conversion unit 6. The optical frequency thereof is "f".

The optical frequency of the other incident light of the optical frequency/voltage conversion unit 6, which is outputted from an optical frequency reference light source 7 is "$f_1$".

The optical frequency/voltage conversion unit 6 generates an error signal of which output is proportional to a difference in optical frequency between two incident lights ($f-f_1$). The high-frequency component thereof is removed by a first low pass filter 8, and after amplified by an amplifier 9, the error signal is fed back into an LD driving current.

Because the change of the LD driving current causes the change of the length L of an external resonator, described in the formula (3), the optical frequency "f" is changed. The optical PLL is formed by setting the characteristics of the feedback loop of the optical PLL so that ($f-f_1$) makes zero, that is, so that the optical frequency "f" is changed close to "$f_1$".

In the feedback control, the method of feeding an electric current into a phase adjustment region, or the like, is adopted other than that of using the LD driving current. However, because the method is equivalent to that of using the LD driving current in point of changing the length of an external resonator, only the case of using the LD driving current will be explained below.

FIG. 12 shows an example of a value of an output error signal with respect to a difference in optical frequency between two incident lights received by the optical frequency/voltage conversion unit 6. When the difference $|f-f_1|$ is larger than $f_{max}$ ($|f-f_1|>f_{max}$), the error signal has a constant value, so that the operation of the optical PLL is not carried out. By previously setting the difference in optical frequency between two incident light by the wavelength control unit 4 so that the error signal is within the range of $\pm V_{max}$, the operation of the optical PLL is carried out.

FIG. 13 shows a construction example of the optical frequency/voltage conversion unit 6.

In FIG. 13, the reference numeral 61 denotes an optical multiplexer, 62 denotes a photoelectric conversion unit, 63 denotes a high pass filter (HPF), 64 denotes a frequency/voltage conversion unit and 65 denotes a reference electrical signal source.

The other branched beam (optical frequency f) of the optical branching unit 5 is multiplexed with the output light (optical frequency $f_1$) of the optical frequency reference light signal 7 by the optical multiplexer 61, and then the multiplexed light is received by the photoelectric conversion unit 62.

The photoelectric conversion 62 corresponds to the optical frequency/voltage conversion unit 6, however, the output of the output signal thereof is proportional to the absolute value of the difference in optical frequency $|f-f_1|$ as shown in FIG. 14. From this reason, when the relationship between the optical frequencies of the lights received by the optical multiplexer 61 is reversed, the photoelectric conversion unit 62 cannot control the signal to be outputted to the HPF 63.

In order to avoid this problem, an offset lock is carried out so that, for example, the difference in optical frequency ($f-f_1$) can make $f_2$. It is required that the offset lock frequency $f_2$ is set to be high enough as compared with a change of the frequency of the received light.

The direct current component of the output from the photoelectric conversion unit 62 is removed by the high pass filter (HPF) 63, and then only the absolute value of the difference in frequency $|f-f_1|$ is outputted to the frequency/voltage conversion unit 64.

The frequency of the electrical signal outputted from the reference electrical signal source 65 which generates a reference electrical signal is the offset frequency $f_2$.

The frequency/voltage conversion unit 64 into which the output signal of the high pass filter (HPF) 63 and the reference signal from the reference electrical signal source 65 are inputted, generates an error signal of which output is proportional to the difference in frequency of the two input signals ($|f-f_1|-f_2$). For example, when the frequency f is higher than $f_1$, the frequency/voltage conversion unit 64 generates the signal of which output is proportional to the difference ($f-f_1-f_2$).

By the construction, the optical frequency f can be stabilized with ($f_1+f_2$).

Next, FIG. 15 shows another construction example of the optical frequency/voltage conversion unit 6 and the optical frequency reference light source 7.

In FIG. 15, the reference numeral 66 denotes a Fabry-Perot interferometer.

The other branched light of the optical branching unit 5 is transmitted through the Fabry-Perot interferometer 66, and is converted into an error signal by the photoelectric conversion unit 62.

FIGS. 16A and 16B show a transmittance characteristics of the Fabry-Perot interferometer 66, and an error signal characteristics of the photoelectric conversion unit 62.

The transmittance characteristics of the Fabry-Perot interferometer 66 has peak wavelengths in the multimode according to the formula (2), similarly to the FIG. 11D.

FIG. 16A shows a transmittance characteristics of the Fabry-Perot interferometer 66 in the mode k.

In this case, a transmittance A of light having the optical frequency $f_1$ is used as a reference corresponding to the optical frequency reference signal 7.

FIG. 16B shows an error signal characteristics of the photoelectric conversion unit 62.

The locking range for locking the mode in which the designated optical frequency can be obtained, has a range of up to about $f_{max}$, in which the output of the error signal is approximately proportional to the difference in optical frequency ($f-f_1$).

Because the optical frequency reference value $f_1$ exists in each mode clearly according to the formula (2), the desirable mode in which the designated frequency can be obtained can be selected and can be locked.

However, in the case of the external cavity LD light source, the optical frequency is largely drifted because a change with the passage of time is caused, in particular, by a fluctuation in temperature. From this reason, the operation of the optical PLL is influenced by a change with the passage of time.

FIGS. 17A to 17C show each characteristics of the optical frequency stabilized external cavity LD light source according to an earlier development.

FIG. 17A shows a change of a DC component of an output from the first low pass filter 8 with the passage of time, FIG. 17B shows a change of LD driving current with the passage of time and FIG. 17C shows a change of the optical frequency f with the passage of time.

After the operation of the optical PLL started at the time $t_1$, by drifting the output from the first low pass filter 8 in accordance with a drift of the optical frequency f due to a change with the passage of time, the optical frequency f is kept constant. At the same time, because the LD driving current is drifted, the output of the output beam which is approximately proportional to the LD driving current is also drifted.

However, after the time $t_2$ when the DC component of the output from the first low pass filter 8 exceeded $V_{max}$, the operation of the optical PLL cannot be carried out, and the drift of the optical frequency occurs with a free run state.

The LD driving current becomes the maximum value ($I_d+\Delta$), where $\Delta$ is the maximum feedback current corresponding to $V_{max}$, which is amplified by the amplifier 9. Then, the LD driving current is not changed.

Further, because the change of the LD driving current causes only the change of the length L of the external resonator, as described above, the characteristics of the optical filter is not changed by the change of the LD driving current. Therefore, according to FIGS. 11B, 11C and 11D, because the characteristics of the optical filters continue to be drifted contrary to the resonator mode locked to $f_1$ at the operation of the optical PLL, an optical frequency gap between $f_1$ and a maximum transmittance rate point (or a maximum reflection rate point) of the optical filter 2 occurs.

Then, when the maximum optical frequency gap extends from mode to mode, the oscillation mode is transited to an adjacent resonator mode, that is, a mode hop occurs.

FIGS. 18A to 18C show characteristics of the optical frequency stabilized external resonator LD light source according to an earlier development in the case of causing a mode hop.

According to the characteristics shown in FIGS. 18A to 18C, the operation of the optical PLL starts at the time $t_1$, similarly to those shown in FIGS. 17A to 17C. However, at the time $t_3$ when the DC component of the output from the first low pass filter 8 is lower than $V_{max}$, a mode hop occurs.

That is, because the optical frequency is changed up to ($f_1+c/(2L)$) in an instant, the output from the first low pass filter 8 reaches a saturation point $V_{max}$. As a result, the operation of the optical PLL cannot be carried out, and then the optical frequency is in a free run state. In this optical frequency ($f_1+c/(2L)$), the term $c/(2L)$ denotes a resonator mode interval and the character c denotes a light velocity.

Because the resonator mode interval of the external cavity LD light source is about 5 GHz in general, in order to assure a normal operation of the optical PLL even though a mode hop occurs, it is required to secure the $f_2$ and $f_{max}$ having at least over 5 GHz frequency.

The change of the optical frequency with respect to the LD driving current is about ⅒ as compared with an LD only, that is, about 0.1 GHz/mA.

Therefore, it is required that the LD driving current for compensating 5 GHz optical frequency gap occurring at a mode hop is about 50 mA. In consideration of the LD driving current of about 100 mA in a normal state, there is possibility that a large change of the optical output occurs.

SUMMARY OF THE INVENTION

The present invention was developed in view of these problems.

An object of the present invention is to provide an optical frequency stabilized LD light source using an external cavity LD, which can prevent a mode hop during an optical frequency control and which can make a change of an optical output small.

That is, in accordance with one aspect of the present invention, the external cavity semiconductor laser light source comprises:

an external cavity semiconductor laser light source unit;

an optical filter for selecting an output beam of the external cavity semiconductor laser light source unit in a single mode;

a drive unit for varying a wavelength of a transmitted light or a wavelength of a reflected light, from the optical filter, and a length of an external resonator;

a wavelength control unit for controlling the drive unit and a semiconductor laser driving current;

an optical branching unit for branching the output beam from the external cavity semiconductor laser light source unit;

an optical frequency reference light source for generating a light having a reference optical frequency;

an optical frequency/voltage conversion unit for receiving the light outputted from the optical frequency reference light source and one of output beams branched by the optical branching unit as incident lights to generate a signal which corresponds to a difference in optical frequency between the two incident lights;

a first low pass filter for interrupting high-frequency component of the signal outputted from the optical frequency/voltage conversion unit;

an amplifier for amplifying an output signal from the first low pass filter to superimpose the output signal on the semiconductor laser driving current;

a second low pass filter for transmitting a low-frequency component of the output signal of the first low pass filter;

a switch for feeding an input signal into the amplifier and for interrupting the input signal, which is located between the first low pass filter and the amplifier; and a frequency control unit for switching on and off the switch to control the drive unit in accordance with a level of an output signal from the second low pass filter.

According to the present invention, because the external cavity semiconductor laser light source comprises a second low pass filter, a switch for feeding an input signal into the amplifier and for interrupting the input signal, and a frequency control unit for switching on and off the switch to control the drive unit in accordance with a level of an output signal from the second low pass filter in addition to an external cavity LD light source, an optical filter, a drive unit, a wavelength control unit, an optical branching unit, an optical frequency reference light source, an optical frequency/voltage conversion unit, a first low pass filter and an amplifier, the external cavity semiconductor laser light source can carry out the following operation.

First, when the external cavity semiconductor laser light source is operated as a normal wavelength tunable LD light source, the switch is turned off and the feedback loop thereof is broken.

Then, the wavelength control unit lengthens the wavelength of the output beam by one step by using the drive unit. When the output value of the second low pass filter is lower than a predetermined value, the frequency control unit turns the switch on. Thereby, the operation of the optical PLL starts.

Further, the frequency control unit continues to check the output of the second low pass filter, and then when the output value of the second low pass filter is not higher than another predetermined value, the frequency control unit commands the wavelength control unit to shorten the wavelength by one step by using the drive unit.

As described above, because the frequency control unit checks the output of the second low pass filter during the optical frequency control so that the output value thereof is within the predetermined range, the optical frequency control is not effected by a mechanical dead band, e.g., a backlash or the like.

Further, because the change with the passage of time is compensated by controlling the same drive unit as the wavelength scanning, a mode hop does not occur.

The optical frequency/voltage conversion unit may comprise;
an optical multiplexer for multiplexing the one of the output beam branched by the optical branching unit with the light generated by the optical frequency reference light source,
a photoelectric conversion unit for converting an output light from the optical multiplexer into an electrical signal,
a high pass filter for removing a DC component of the electrical signal from the photoelectric conversion unit,
a reference electrical signal source for generating a signal having a reference frequency, and
a frequency/voltage conversion unit for receiving the signal from the reference electrical signal source and a transmittance signal through the high pass filter as input signals to generate a signal which corresponds to a difference in frequency between the two input signals.

According to the present invention, because the optical frequency/voltage conversion unit comprises an optical multiplexer, a photoelectric conversion unit, a high pass filter, a reference electrical signal source and a frequency/voltage conversion unit, the external cavity semiconductor laser light source can carry out the following operation.

First, the branched light from the optical branching unit is multiplexed with the output light from the optical frequency reference light signal by the optical multiplexer, and then the multiplexed light is received by the photoelectric conversion unit.

The DC component of the output from the photoelectric conversion unit is removed from the output therefrom through the high pass filter, and then only the component of the absolute value of the difference in frequency is outputted.

The frequency of the electrical signal outputted from the reference electrical signal source is the offset frequency. The frequency/voltage conversion unit into which the output signal of the high pass filter and the reference signal from the reference electrical signal source are inputted, generates an error signal which corresponds to the difference in frequency between the two input signals.

The combination of the optical frequency reference light source and the optical frequency/voltage conversion unit may comprise;
a Fabry-Perot resonator for receiving the one of the output beams branched by the optical branching unit, and
a photoelectric conversion unit for converting a transmitted light through the Fabry-Perot resonator into an electrical signal.

According to the present invention, because the combination of the optical frequency reference light source and the optical frequency/voltage conversion unit comprises a Fabry-Perot resonator and a photoelectric conversion unit, a transmitted light through the Fabry-Perot resonator, which is received from the optical branching unit is converted into an electrical signal as an error signal by the photoelectric conversion unit.

The external cavity semiconductor laser light source may further comprises; a second drive unit for varying a wavelength of a transmitted light or a wavelength of a reflected light, from the optical filter, and a length of an external resonator,
wherein the frequency control unit switches on and off the switch to control the second drive unit in accordance with a level of the output signal from the second low pass filter.

According to the present invention, because the external cavity semiconductor laser light source further comprises a second drive unit for varying a wavelength of a transmitted light or a wavelength of a reflected light, from the optical filter, and a length of an external resonator, wherein the frequency control unit switches on and off the switch to control the second drive unit in accordance with a level of the output signal from the second low pass filter, the external cavity semiconductor laser light source can carry out the following operation.

First, in the case that the continuous wavelength tuning can be carried out by the drive unit, the second drive unit having a high wavelength setting resolution enables the change of the LD driving current to be smaller.

In the case that the wavelength set is carried out at intervals of only about 1 pm by the drive unit, the second drive unit varies only the length L of the external resonator and the wavelength set of the optical filter is carried out at intervals of about 1 pm by the drive unit. When the wavelength set value of the optical filter is λ, the second drive unit sets the resonator mode wavelength so as to subdivide the resonator mode in the range from λ to λ+0.5 pm. Then, in the wavelength range from λ+0.5 pm to λ+1.5 pm, by varying the wavelength set value of the optical filter to λ+1 pm, the wavelength set of the output beam is carried out. As a result, the operation of the continuous wavelength tuning can be carried out.

A mode hop is not caused by a wavelength gap of about 1 pm.

In accordance with another aspect of the present invention, the external cavity semiconductor laser light source comprises:

an external cavity semiconductor laser light source unit;

an optical filter for selecting an output beam of the external cavity semiconductor laser light source unit in a single mode;

a drive unit for varying a wavelength of a transmitted light or a wavelength of a reflected light, from the optical filter;

a wavelength control unit for controlling the drive unit;

an optical frequency reference light source for generating a light having a reference optical frequency;

an optical frequency/voltage conversion unit for generating a signal which corresponds to a difference in optical frequency between the light outputted from the optical frequency reference light source and the output beam of the external cavity semiconductor laser light source unit;

a low pass filter for transmitting a low-frequency component of the signal of the optical frequency/voltage conversion unit;

a switch for feeding the signal into the external cavity semiconductor light source and for interrupting the signal; and a frequency control unit for switching on and off the switch to control the drive unit.

BRIEF DESCRIPTION OF DRAWINGS

The present invention will become more fully understood from the detailed description given hereinbelow and the accompanying drawings which are given by way of illustration only, and thus are not intended as a definition of the limits of the present invention, and wherein;

FIGS. 3A to 3C are views showing characteristics of an optical frequency stabilized external cavity LD light source, in which FIG. 3A is a view showing a change of a characteristics of output from the second low pass filter with the passage of time, FIG. 3B is a view showing a change of a characteristics of LD driving current with the passage of time, and FIG. 3C is a view showing a change of a characteristics of optical frequency with the passage of time;

FIG. 4 is a view showing a construction of the optical frequency stabilized external cavity LD light source according to another embodiment to which the present invention is applied;

FIGS. 11A to 11E are views for explaining of the principle of oscillation mode selection of the external cavity LD light source having a combination of a diffraction grating and an interference filter, as an optical filter, in which FIG. 11A is a view showing a characteristics of wavelength-LD gain, FIG. 11B is a view showing a characteristics of wavelength-resonator mode, FIG. 11C is a view showing a characteristics of wavelength-grating reflectivity, FIG. 11D is a view showing a characteristics of wavelength-interference filter transmittance, and FIG. 11E is a view showing a characteristics of wavelength-oscillation mode;

FIGS. 16 are views showing characteristics of transmittance and of error signal, in which

FIGS. 17 are views showing characteristics of an optical frequency stabilized external cavity LD light source according to an earlier development, in which FIGS. 18 are views showing characteristics of an optical frequency stabilized external cavity LD light source according to an earlier development in the case of causing a mode hop, in which

PREFERRED EMBODIMENT OF THE INVENTION

Each embodiment of the external cavity LD light source according to the present invention will be explained with reference to FIGS. 1 to 4, as follows.

First Embodiment

Figure 1:
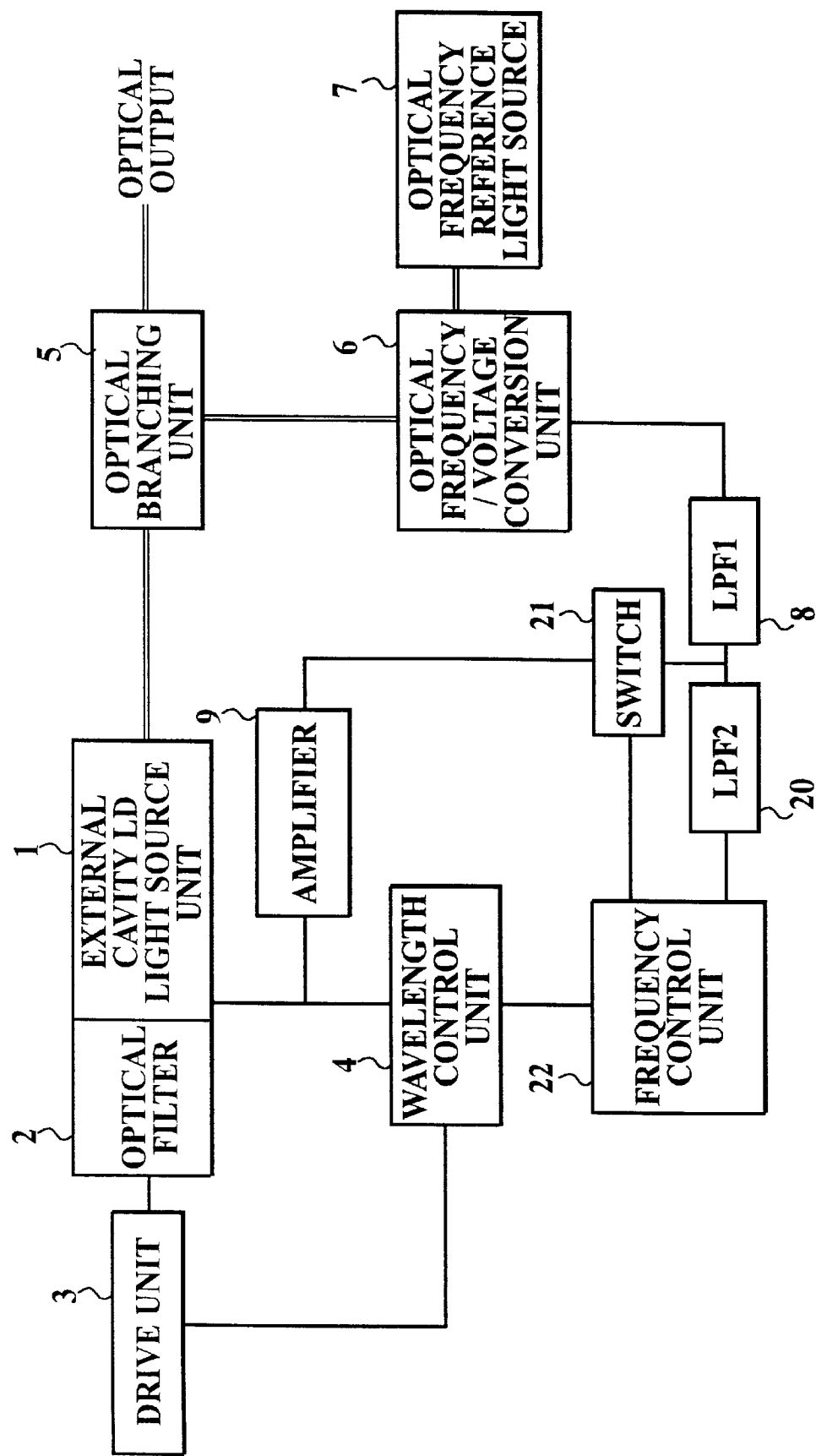
FIG. 1 is a view showing a construction of the optical frequency stabilized external cavity LD light source according to an embodiment to which the present invention is applied.
Figure 5:
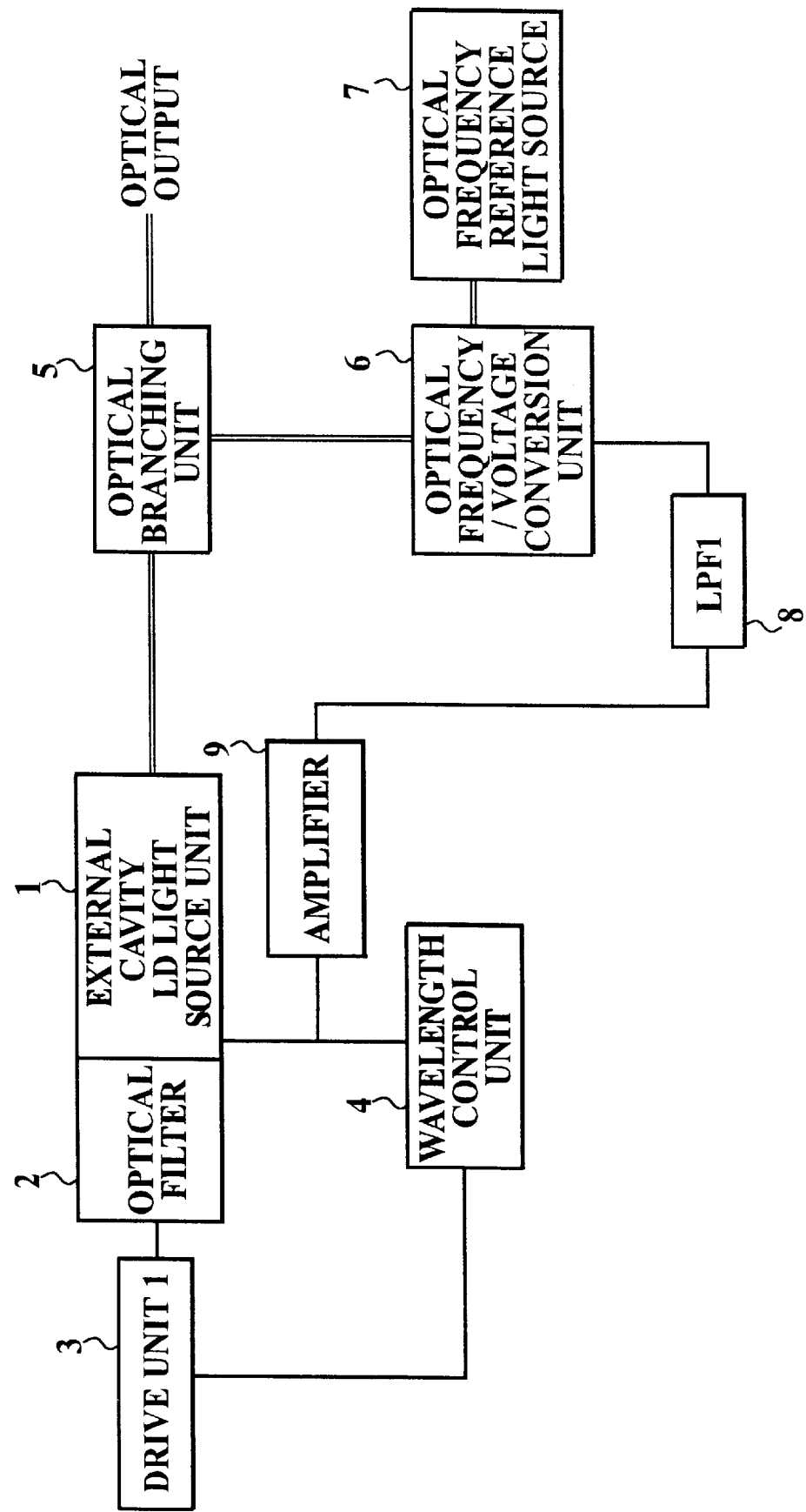
FIG. 5 is a view showing a construction of the optical frequency stabilized external cavity LD light source according to an earlier development.
Figure 6:
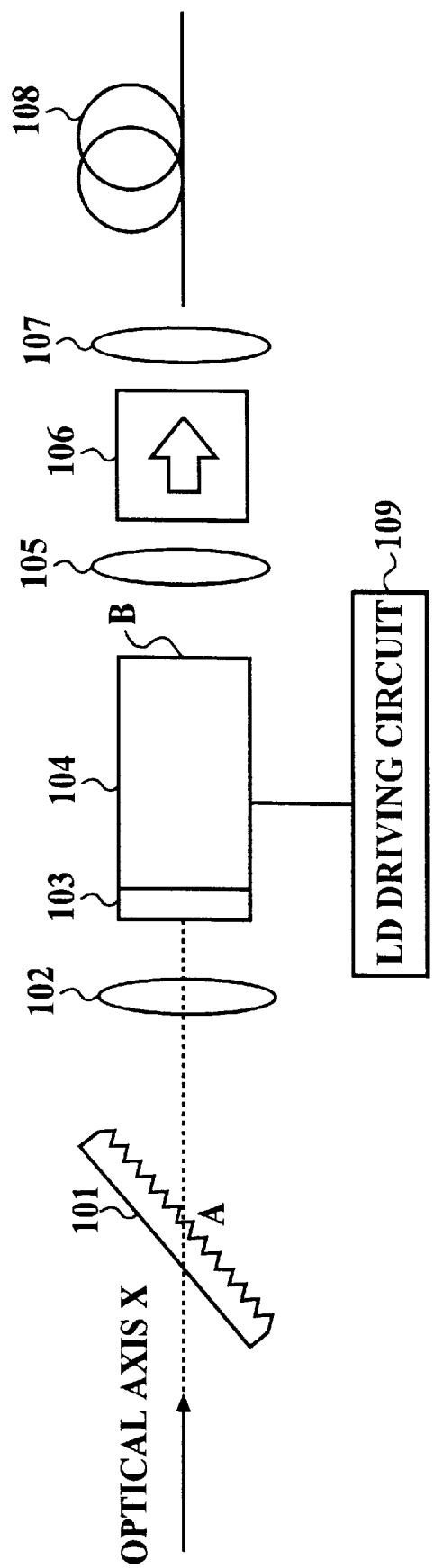
FIG. 6 is a view showing a construction example of the optical system of the external cavity LD light source shown in FIG. 5.
Figure 7:
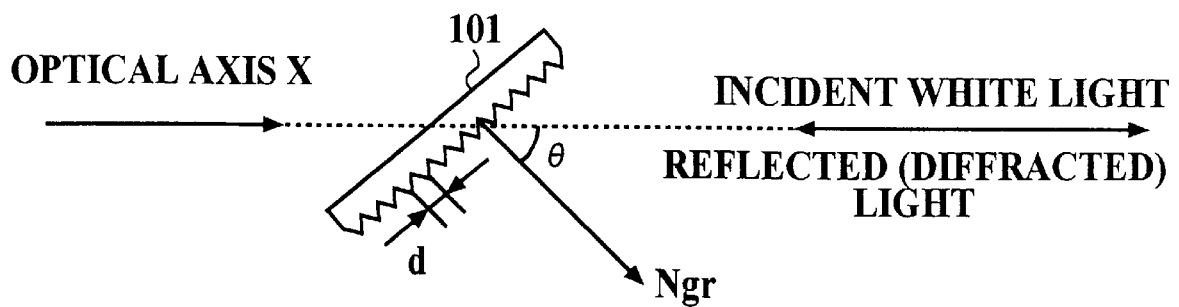
FIG. 7 is a view showing an optical system of the diffraction grating shown in FIG. 6.
Figure 8:
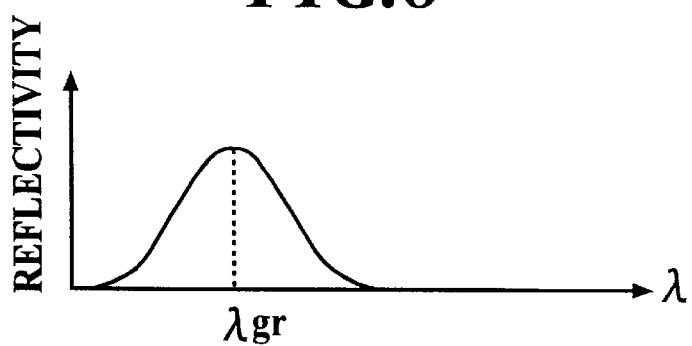
FIG. 8 is a view showing a characteristics of wavelength-reflectivity of the diffraction grating shown in FIG. 6.
Figure 9:
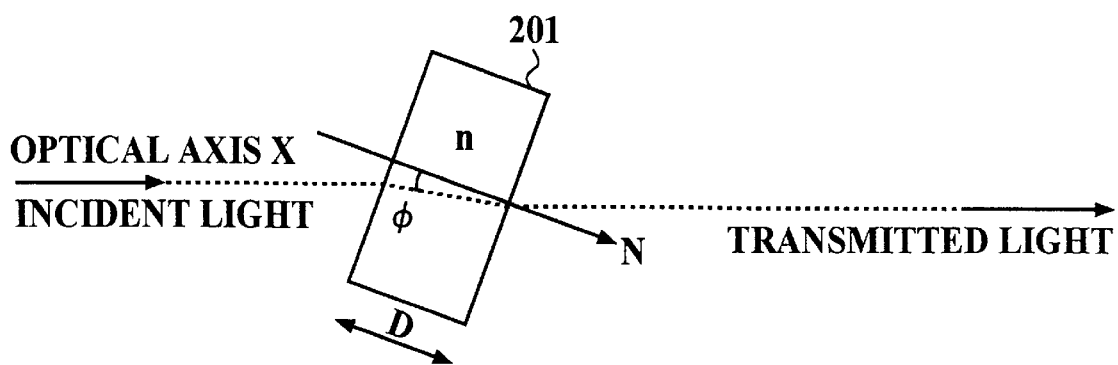
FIG. 9 is a view showing an optical system of the interference filter, as an optical filter shown in FIG. 5.
Figure 10:
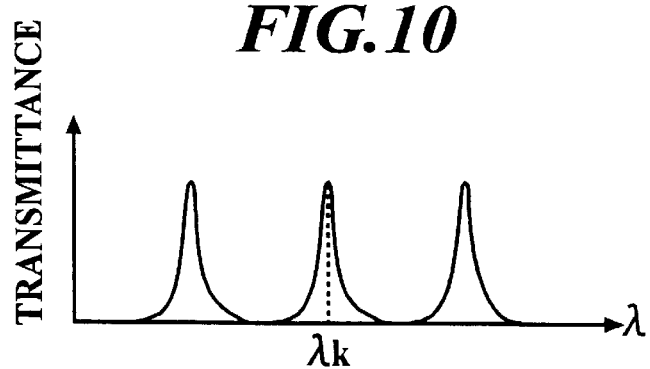
FIG. 10 is a view for showing a characteristics of wavelength-transmittance of the interference filter, as an optical filter shown in FIG. 5.
Figure 11A:
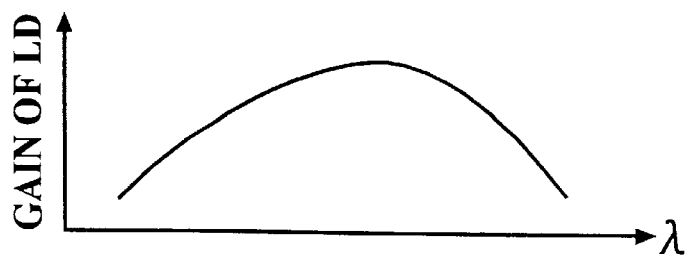
Figure 11B:
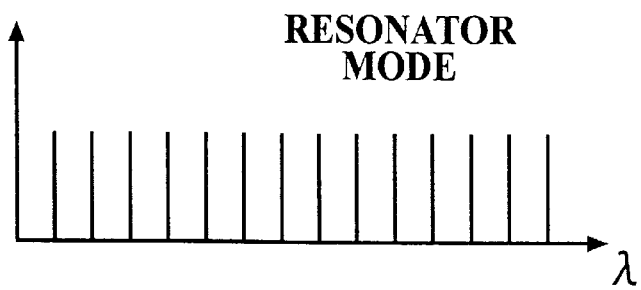
Figure 11C:
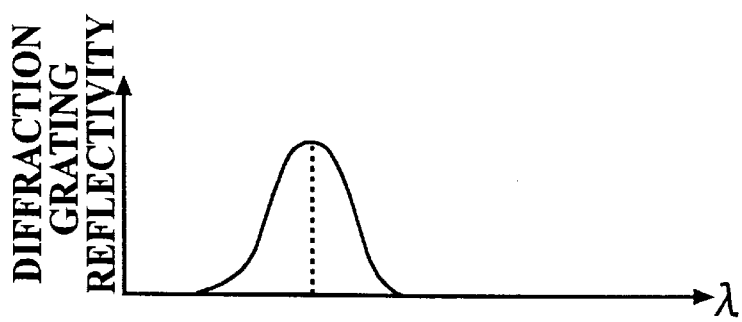
Figure 11D:
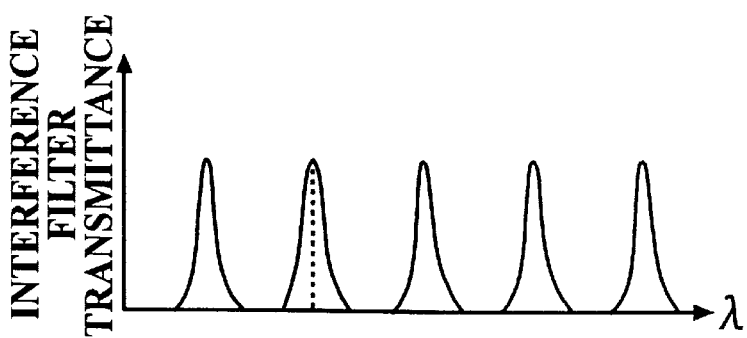
Figure 11E:
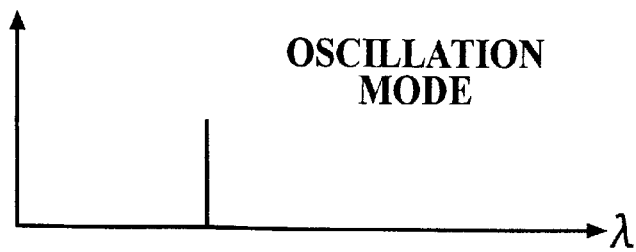
Figure 12:
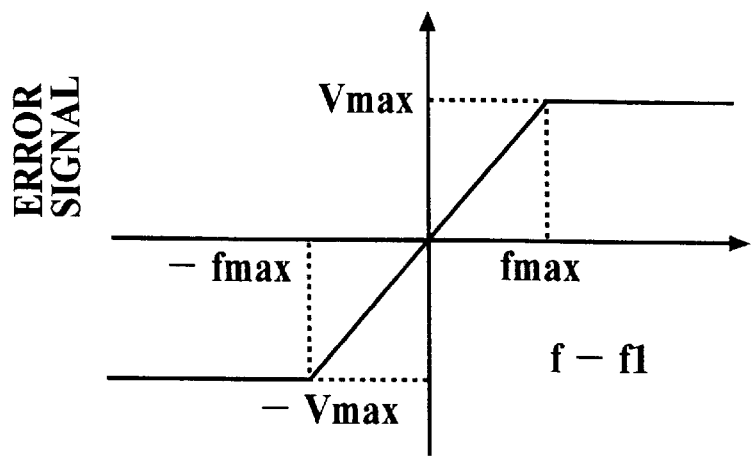
FIG. 12 is a view showing an output characteristics of an optical frequency voltage conversion unit.
Figure 13:
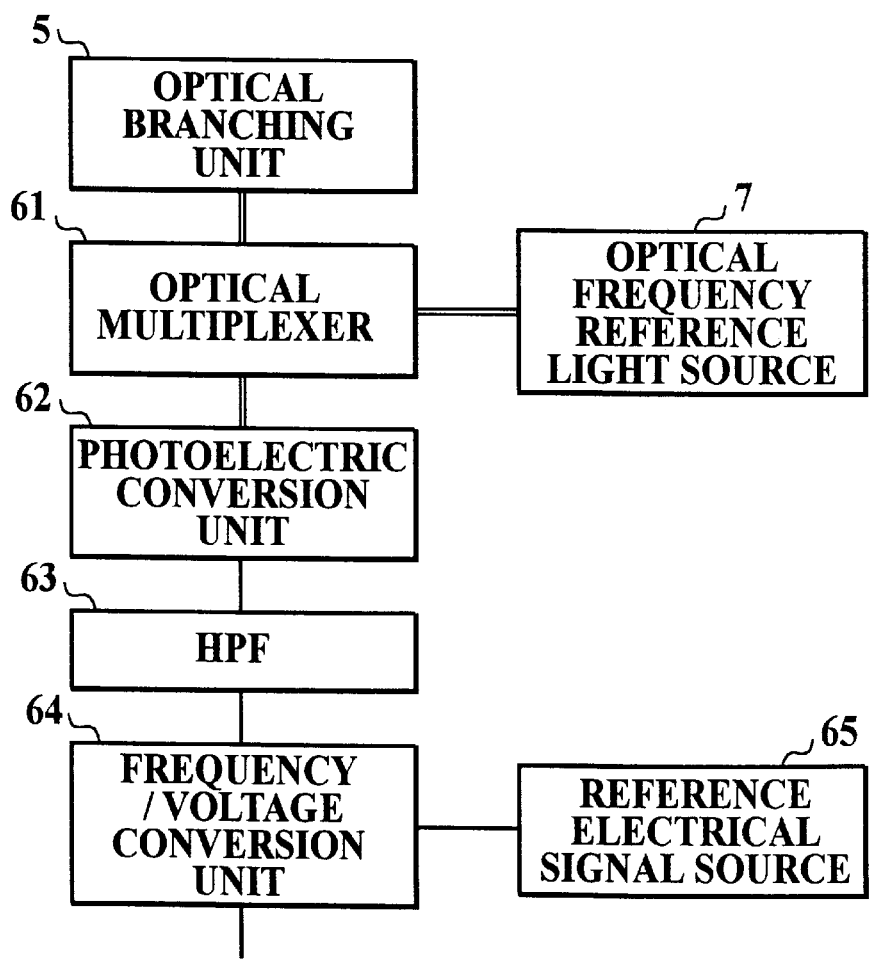
FIG. 13 is a view showing a construction of the optical frequency/voltage conversion unit.
Figure 14:
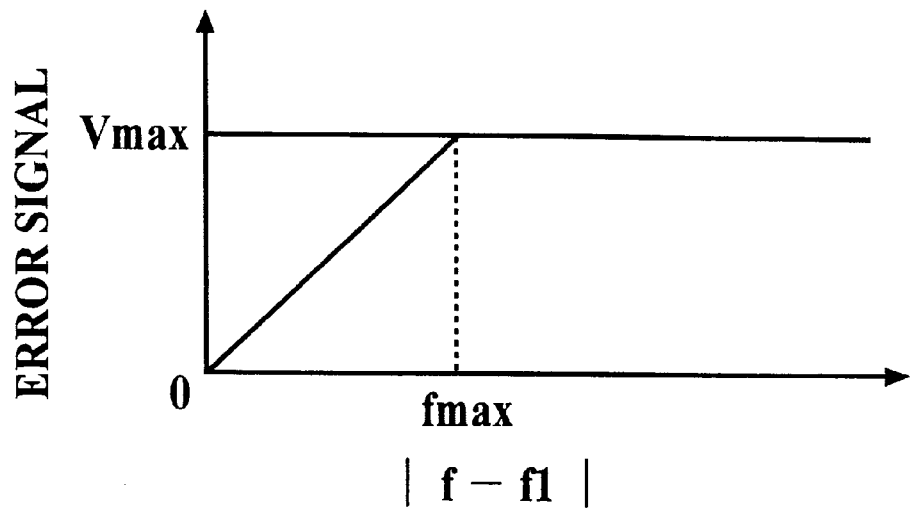
FIG. 14 is a view showing a characteristics of error signal outputted from the optical frequency/voltage conversion unit.
Figure 15:
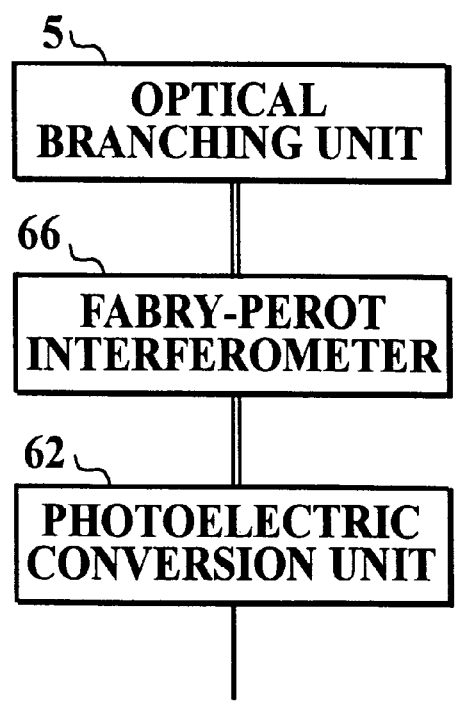
FIG. 15 is a view showing a construction of a combination of an optical frequency/voltage conversion unit and an optical frequency reference light source.
Figure 16A:
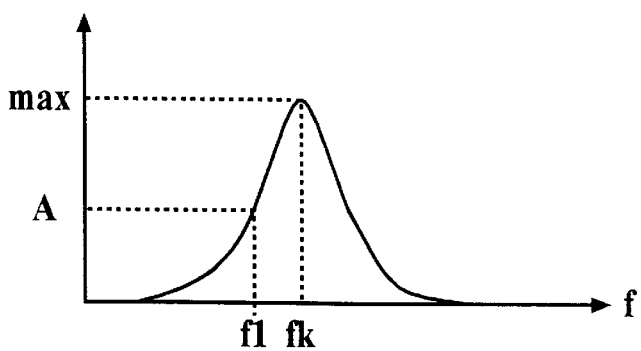
FIG. 16A is a view showing a transmittance characteristics of a Fabry-Perot interferometer in mode k.
Figure 16B:
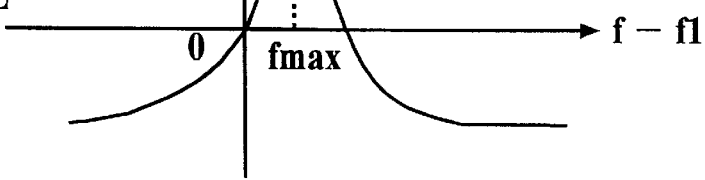
FIG. 16B is a view showing a characteristics of an error signal outputted from the optical frequency/voltage conversion unit.

FIG. 1 is a block diagram showing a construction of an optical frequency stabilized external resonator of LD light source according to first embodiment to which the present invention is applied. In this figure, the same elements and the like as corresponding to ones shown in FIG. 5 have the same reference numerals, and the detailed explanation for them will be omitted.

In FIG. 1, the reference numeral 20 denotes a second low pass filter (LPF2), 21 denotes a switch, and 22 denotes a frequency control unit.

That is, in this embodiment, as shown in FIG. 1, the second low pass filter 20 is provided between the first low pass filter 8 and the frequency control unit 22 connected with the wavelength control unit 4 so as to be in parallel with the amplifier 9. The switch 21 is provided between the amplifier 9 and the first low pass filter 8, and is also connected with the frequency control unit 22 to receive an on or off control signal therefrom.

The frequency control unit 22 for checking the output from the second low pass filter 20 to control an on-off control of the switch 21 is provided between the second low pass filter 20 and the wavelength control unit 4 and is connected with the switch 21. The frequency control unit 22 outputs a signal to the wavelength control unit 4.

In the embodiment, the basic operation of the external cavity LD light source and the optical frequency stabilization using an error signal feedback for feeding back an error signal into the LD driving current are same as the above-described earlier development (referred to FIG. 5).

First, the method of locking the resonator mode to the frequency of the light outputted from the optical frequency reference light source 7 during the normal operation of the external cavity LD light source as a wavelength tunable LD light source will be explained with reference to the flow chart shown in FIG. 2, as follows.

When the external cavity LD light source is operated as a normal wavelength tunable LD light source, the switch 21 is turned off and the feedback loop thereof is broken.

It is assumed that the output value of the second low pass filter 20 is $V_{max}$ at this time.

Further, it is assumed that the output of the second low pass filter 20 decreases when the wavelength scanning is carried out so that the wavelength of the light outputted from the LD light source is lengthened. When the wavelength is lengthened by the wavelength resolution of about 1 pm, that is, by one step, the output value of the second low pass filter 20 decreases by about $V_{th}$. The $V_{th}$ corresponds to 0.1 GHz in optical frequency. Because $V_{max}$ is higher than 5 GHz in optical frequency as described above, $V_{th}$ is much lower than $V_{max}$ ($V_{th} << V_{max}$).

Figure 2:
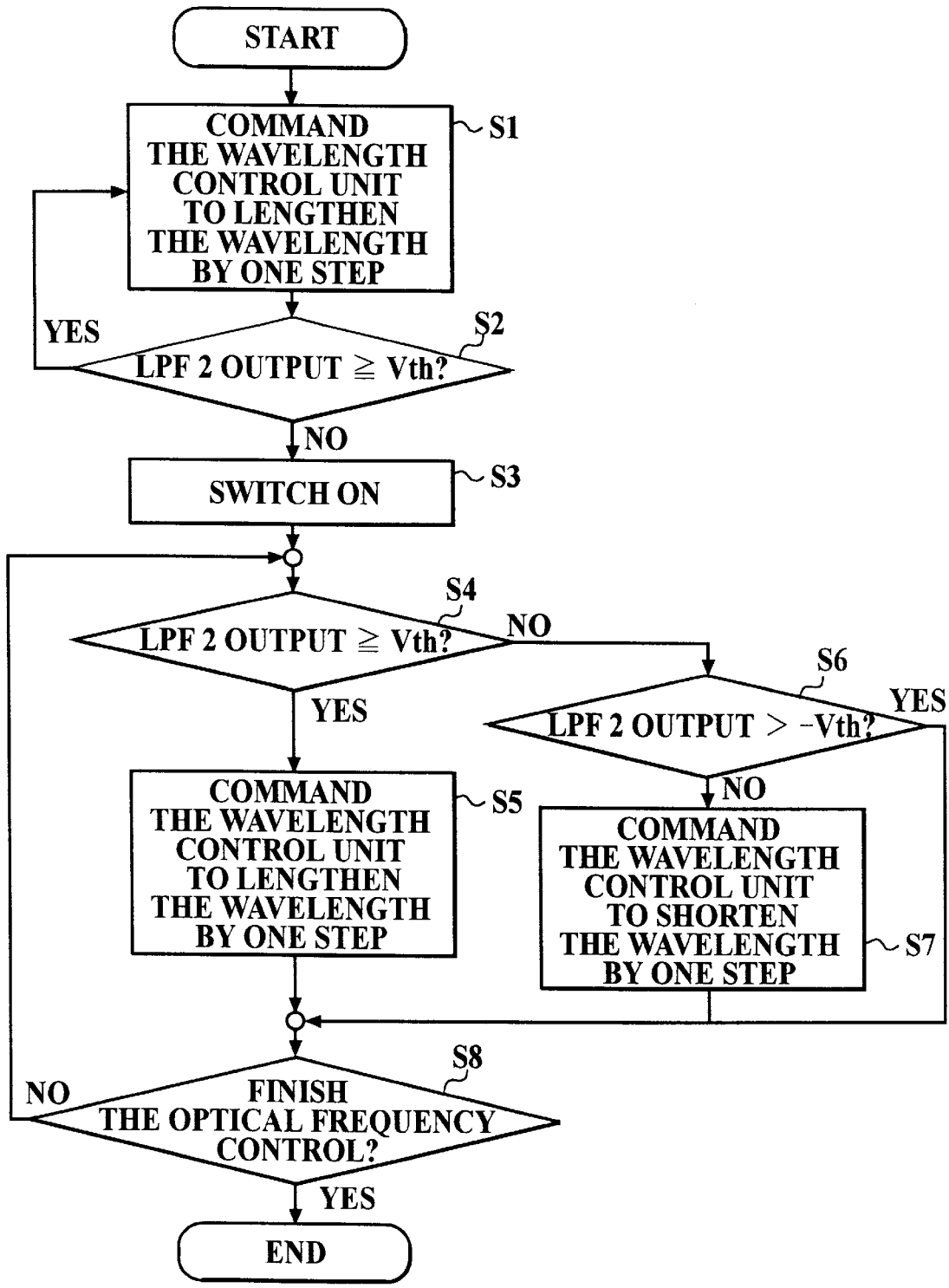
FIG. 2 is a view showing a flow chart for explaining a drift control.

In the flow chart shown in FIG. 2, at the step S1, the wavelength control unit 4 lengthens the wavelength by one step by using the first drive unit 3.

When the output value of the second low pass filter is lower than $V_{th}$ at the step S2, the frequency control unit 22 turns the switch 21 on at the step S3. Thereby, the operation of the optical PLL starts.

At the step S4, the frequency control unit 22 continues to check the output of the second low pass filter 20, and then when the output value of the second low pass filter 20 is not lower than $V_{th}$, the frequency control unit 22 commands the wavelength control unit 4 to lengthen the wavelength by one step by using the first drive unit 3 at the step S5.

At the step S6, the frequency control unit 22 continues to check the output of the second low pass filter 20, and then when the output value of the second low pass filter 20 is not higher than $-V_{th}$, the frequency control unit 22 commands the wavelength control unit 4 to shorten the wavelength by one step by using the first drive unit 3 at the step S7.

As described above, because the frequency control unit 22 checks the output of the second low pass filter 20 during the optical frequency control so that the output value thereof has a range of $\pm V_{th}$, the optical frequency control is not effected by the mechanical dead band, e.g., backlash or the like.

Figure 17A:
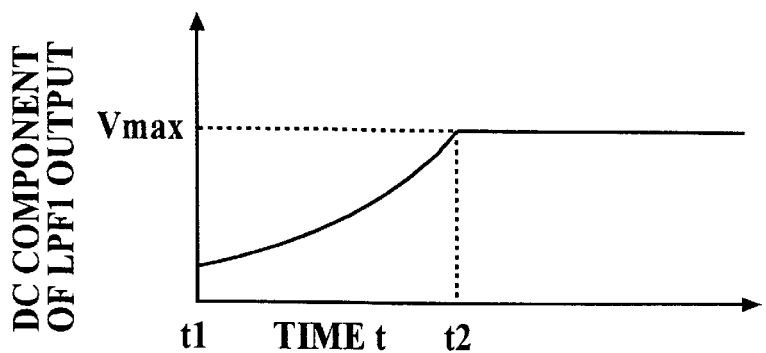
FIG. 17A is a view showing a change of a DC component of an output from the first low pass filter with the passage of time.
Figure 17B:
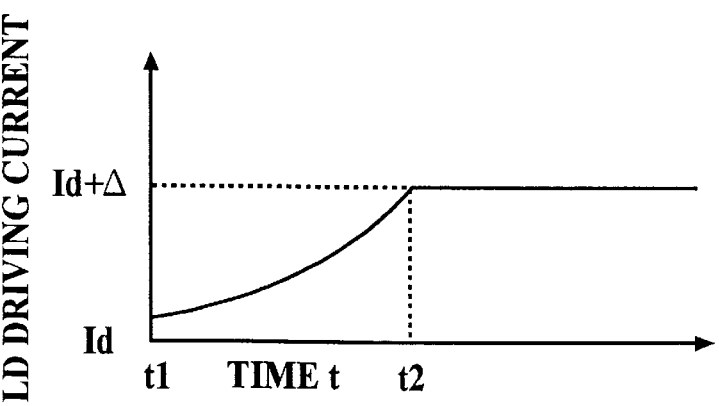
FIG. 17B is a view showing a change of an LD driving current with the passage of time.
Figure 17C:
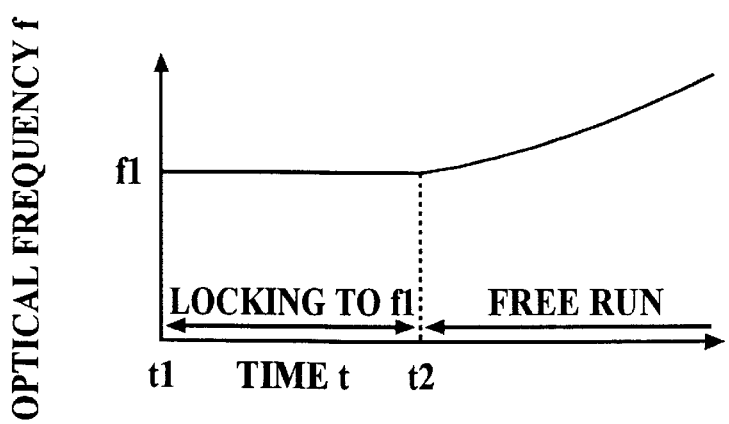
FIG. 17C is a view showing a change of an optical frequency with the passage of time.
Figure 18A:
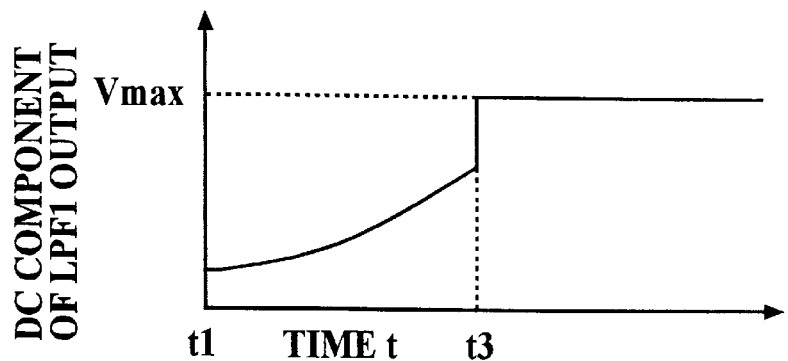
FIG. 18A is a view showing a change of a DC component of an output from the first low pass filter with the passage of time.
Figure 18B:
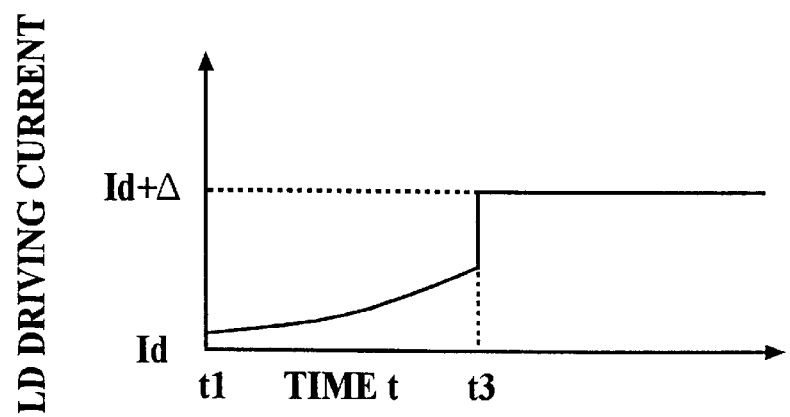
FIG. 18B is a view showing a change of an LD driving current with the passage of time.
Figure 18C:
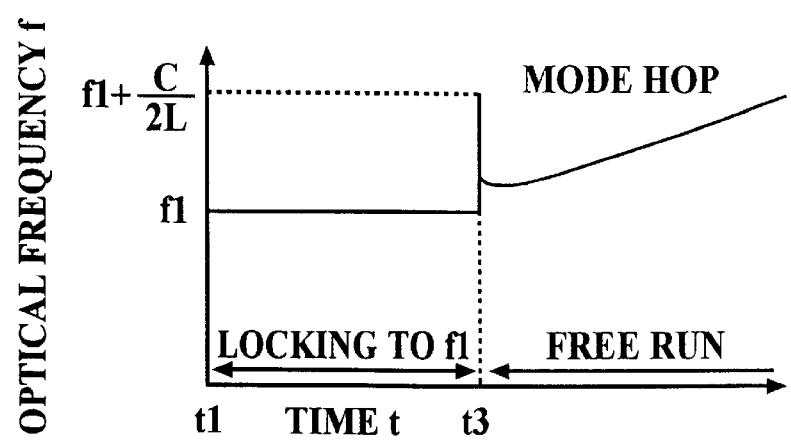
FIG. 18C is a view showing a change of an optical frequency with the passage of time.

Further, because the above-described change with the passage of time, as shown in FIGS. 17A to 17C, is compensated by controlling the same first drive unit 3 as the wavelength scanning, the optical frequency gap between $f_1$ and a maximum transmittance rate point (or a maximum reflection rate point) of the optical filter 2 does not amount to 5 GHz. As a result, a mode hop does not occur.

Such a check of the output from the second low pass filter 20, carried out by the frequency control unit 22 continues until the optical frequency control for carrying out the wavelength scanning or the like, is finished, as shown in the step S8.

The above descriptions are the explanations about the flow chart of the optical frequency stabilizing control.

Next, a state of the optical frequency control will be explained with reference to FIGS. 3A to 3C, as follows.

Figure 3A:
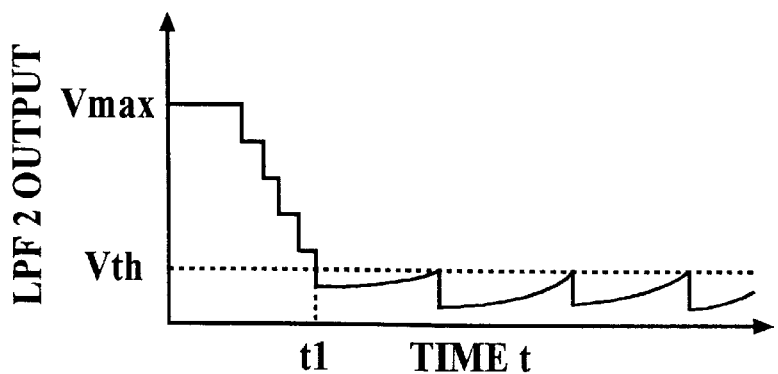
Figure 3B:
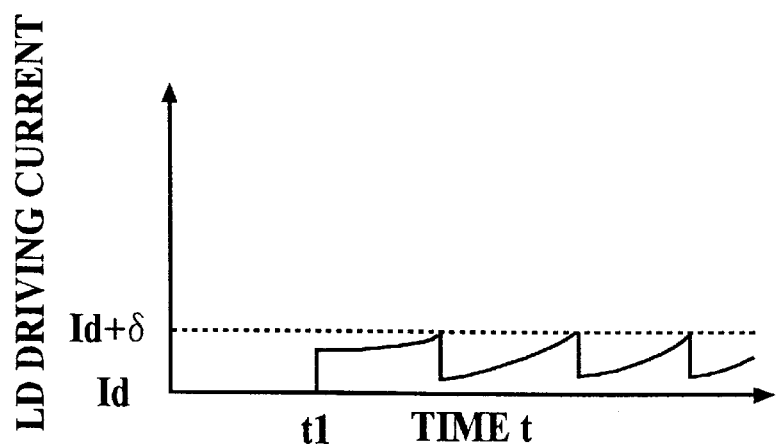
Figure 3C:
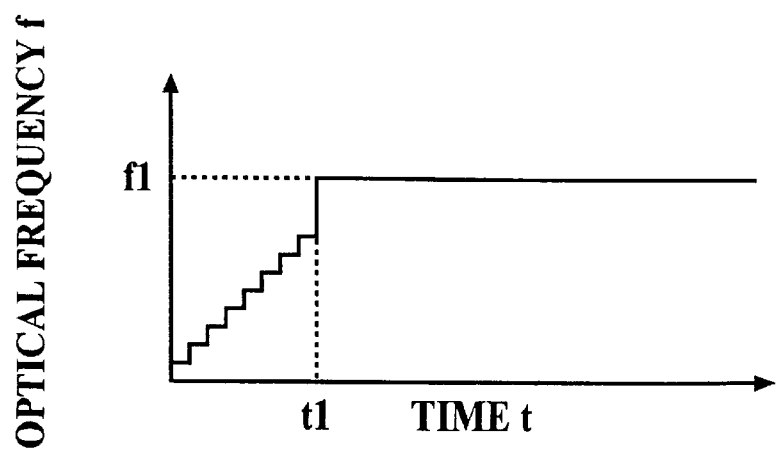

FIGS. 3A to 3C are views showing characteristics of an optical frequency stabilized external cavity LD light source, in which FIG. 3A is a view showing a change of a characteristics of output from the second low pass filter 20 with the passage of time, FIG. 3B is a view showing a change of a characteristics of LD driving current with the passage of time, and FIG. 3C is a view showing a change of a characteristics of optical frequency with the passage of time.

By the wavelength step scanning, the output from the second low pass filter 20 is lower than $V_{th}$ at the time $t_1$, and then the operation of the optical PLL starts by turning on the switch 21.

Thereafter, whenever the output from the second low pass filter 20 exceeds $V_{th}$, the wavelength is lengthened by one step, and a drift of the output from the second low pass filter 20 is controlled within $V_{th}$. As a result, the LD driving current can be controlled within the maximum value ($I_d+\delta$). Because $V_{th}$ is much lower than $V_{max}$ ($V_{th} << V_{max}$), the varying value $\delta$ of the LD driving current is much smaller than $\Delta$ ($\delta << \Delta$).

Therefore, no matter how much the optical frequency is drifted, the drift thereof is compensated by the above-described wavelength scanning, so that a mode hop does not occur. Further, because the output from the second low pass filter is about $V_{th}$, the optical frequency f is controlled so as to be $f_1$ as shown in FIG. 3C.

Second Embodiment

FIG. 4 is a block diagram showing a construction of an optical frequency stabilized external resonator of LD light source according to second embodiment to which the present invention is applied. In this figure, the same elements and the like as corresponding to ones shown in FIG. 1 have the same reference numerals, and the detailed explanation for them will be omitted.

In FIG. 4, the reference numeral 23 denotes a second drive unit (drive unit 2).

That is, in this embodiment, as shown in FIG. 4, the second drive unit 23 is provided in addition to the construction of an optical frequency stabilized external resonator of LD light source according to first embodiment. The second drive unit 23 is controlled by the frequency control unit 22.

In this embodiment, the optical frequency stabilized external cavity LD light source shown in FIG. 4 can be operated basically the same as that shown in FIG. 1.

In the case that the continuous wavelength tuning can be carried out by the first drive unit 3 as a wavelength tunable light source, the second drive unit 23 having a high wavelength setting resolution enables the varying value $\delta$ of the LD driving current to be smaller.

In the case that the wavelength set is carried out at intervals of only about 1 pm by the first drive unit 3 as a wavelength tunable light source, the second drive unit 23 varies only the length L of the external resonator, and the wavelength set of the optical filter 2 is carried out at intervals of about 1 pm by the first drive unit 3.

When the wavelength set value of the optical filter 2 is λ, the second drive unit 23 sets the resonator mode wavelength so as to subdivide the resonator mode in the range from λ to λ+0.5 pm. Then, in the wavelength range from λ+0.5 pm to λ+1.5 pm, by varying the wavelength set value of the optical filter 2 to λ+1 pm, the wavelength set of the output beam is carried out. As a result, the operation of the continuous wavelength tuning can be carried out. A mode hop is not caused by a wavelength gap of about 1 pm.

In a general light source, one step of a wavelength, corresponding to $V_{th}$ is about 1 pm. When the one step is calculated in driving current, the one step corresponds to one having a range of δ to 1 mA. On the country, for example, when the wavelength setting resolution of about 0.1 pm can be obtained by using PZT (lead zirconate titanate) provided for the second drive unit 23, the varying value of the LD driving current can be suppressed within a range of δ to 0.1 mA.

In the case that the ratio between optical output and LD driving current is 0 dBm / 100 mA (optical output / LD driving current=0 dBm / 100 mA), a variation of 0.1 mA in LD driving current corresponds to a variation of about 0.005 dB in optical output.

As described above, because the error signal of the optical PLL is checked, and the optical frequency is compensated by carrying out a wavelength scanning by the frequency control unit when the drift value exceeds the wavelength setting resolution, the optical frequency stabilized external cavity LD light source enables a mode hop to be prevented and enables a change of optical output to be smaller.

Although the present invention has been explained according to each embodiment, the present invention is not limited to these embodiments. Any arrangement and construction, of the members may be used without departing from the gist thereof.

Further, with respect to detailed parts of other structures, the structures may be suitably modified, as a matter of course.

According to the external cavity LD light source, because the external cavity LD light source comprises the second low pass filter, a switch for feeding an input signal into the amplifier and for interrupting the input signal, and a frequency control unit for switching on and off the switch to control the drive unit in accordance with a level of an output signal from the second low pass filter, even when a drift of optical frequency is caused by a change of temperature or the like, a change of optical output can be prevented so as to stabilize the optical output.

Because the error signal which corresponds to a difference in frequency between the output signal from the high pass filter and the reference electrical signal is generated, the optical frequency of the optical output can be stabilized by using the error signal.

Further, because the error signal is generated by converting the transmitted light through the Fabry-Perot resonator into an electrical signal, the optical frequency of the optical output can be stabilized by using the error signal.

Because the error signal of the optical PLL is checked, and the optical frequency is compensated by carrying out a wavelength scanning by the frequency control unit when the drift value exceeds the wavelength setting resolution, the external cavity LD light source enables a mode hop to be prevented and enables a change of optical output to be smaller.

The entire disclosure of Japanese Patent Application No. Tokugan-Hei 9-255451 filed on Sep. 19, 1997 including specification, claims drawings and summary are incorporated herein by reference in its entirety.

What is claimed is:

1. An external cavity semiconductor laser light source comprising:
    an external cavity semiconductor laser light source unit;
    an optical filter for selecting an output beam of the external cavity semiconductor laser light source unit in a single mode;
    a drive unit for varying a wavelength of a transmitted light or a wavelength of a reflected light, from the optical filter, and a length of an external resonator;
    a wavelength control unit for controlling the drive unit and a semiconductor laser driving current;
    an optical branching unit for branching the output beam from the external cavity semiconductor laser light source unit;
    an optical frequency reference light source for generating a light having a reference optical frequency;
    an optical frequency/voltage conversion unit for receiving the light outputted from the optical frequency reference light source and one of output beams branched by the optical branching unit as incident lights to generate a signal which corresponds to a difference in optical frequency between the two incident lights;
    a first low pass filter for interrupting high-frequency component of the signal outputted from the optical frequency/voltage conversion unit;
    an amplifier for amplifying an output signal from the first low pass filter to superimpose the output signal on the semiconductor laser driving current;
    a second low pass filter for transmitting a low-frequency component of the output signal of the first low pass filter;
    a switch for feeding an input signal into the amplifier and for interrupting the input signal, which is located between the first low pass filter and the amplifier; and
    a frequency control unit for switching on and off the switch to control the drive unit in accordance with a level of an output signal from the second low pass filter.

2. An external cavity semiconductor laser light source as claimed in claim 1, wherein the optical frequency/voltage conversion unit comprises;
    an optical multiplexer for multiplexing the one of the output beams branched by the optical branching unit with the light generated by the optical frequency reference light source,
    a photoelectric conversion unit for converting an output light from the optical multiplexer into an electrical signal,
    a high pass filter for removing a DC component of the electrical signal of the photoelectric conversion unit,
    a reference electrical signal source for generating a signal having a reference frequency, and
    a frequency/voltage conversion unit for receiving the signal from the reference electrical signal source and a transmittance signal through the high pass filter as input signals to generate a signal which corresponds to a difference in frequency between the two input signals.

3. An external cavity semiconductor laser light source as claimed in claim 1, wherein a combination of the optical frequency reference light source and the optical frequency/voltage conversion unit comprises;
    a Fabry-Perot resonator for receiving the one of the output beams branched by the optical branching unit, and a photoelectric conversion unit for converting a transmitted light through the Fabry-Perot resonator into an electrical signal.

4. An external cavity semiconductor laser light source as claimed in claim 1, further comprising;

a second drive unit for varying a wavelength of a transmitted light or a wavelength of a reflected light, from the optical filter, and a length of an external resonator, wherein the frequency control unit switches on and off the switch to control the second drive unit in accordance with a level of the output signal from the second low pass filter.

5. An external cavity semiconductor laser light source as claimed in claim 2, further comprising;

a second drive unit for varying a wavelength of a transmitted light or a wavelength of a reflected light, from the optical filter, and a length of an external resonator, wherein the frequency control unit switches on and off the switch to control the second drive unit in accordance with a level of the output signal from the second low pass filter.

6. An external cavity semiconductor laser light source as claimed in claim 3, further comprising;

a second drive unit for varying a wavelength of a transmitted light or a wavelength of a reflected light, from the optical filter, and a length of an external resonator, wherein the frequency control unit switches on and off the switch to control the second drive unit in accordance with a level of the output signal from the second low pass filter.

7. An external cavity semiconductor laser light source comprising:

an external cavity semiconductor laser light source unit;

an optical filter for selecting an output beam of the external cavity semiconductor laser light source unit in a single mode;

a drive unit for varying a wavelength of a transmitted light or a wavelength of a reflected light, from the optical filter;

a wavelength control unit for controlling the drive unit;

an optical frequency reference light source for generating a light having a reference optical frequency;

an optical frequency/voltage conversion unit for generating a signal which corresponds to a difference in optical frequency between the light outputted from the optical frequency reference light source and the output beam of the external cavity semiconductor laser light source unit;

a low pass filter for transmitting a low-frequency component of the signal of the optical frequency/voltage conversion unit;

a switch for feeding the signal into the external cavity semiconductor light source and for interrupting the signal; and a frequency control unit for switching on and off the switch to control the drive unit.

* * * * *